United States Patent [19]
Bloker et al.

[11] Patent Number: 5,768,196
[45] Date of Patent: Jun. 16, 1998

[54] SHIFT-REGISTER BASED ROW SELECT CIRCUIT WITH REDUNDANCY FOR A FIFO MEMORY

[75] Inventors: Raymond E. Bloker, San Jose, Calif.; Andrew L. Hawkins, Starkville, Miss.; Stefan P. Sywyk, San Jose, Calif.

[73] Assignee: Cypress Semiconductor Corp., San Jose, Calif.

[21] Appl. No.: 609,852

[22] Filed: Mar. 1, 1996

[51] Int. Cl.$^6$ .................................................. G11C 7/00
[52] U.S. Cl. .................. 365/200; 365/189.12; 365/221; 365/219
[58] Field of Search ............................. 365/200, 189.12, 365/221, 219

[56] References Cited

U.S. PATENT DOCUMENTS

| | | | |
|---|---|---|---|
| 4,807,191 | 2/1989 | Flannagan | 365/189 |
| 4,961,169 | 10/1990 | Matsumura et al. | 365/189.12 |
| 5,083,294 | 1/1992 | Okajima | 365/200 |
| 5,233,559 | 8/1993 | Brennan, Jr. | 365/200 |
| 5,267,205 | 11/1993 | Hamada | 365/200 |
| 5,381,370 | 1/1995 | Lacey et al. | 365/200 |
| 5,546,347 | 8/1996 | Ko et al. | 365/221 |

*Primary Examiner*—Vu A. Le
*Attorney, Agent, or Firm*—Blakely, Sokoloff, Taylory & Zafman LLP

[57] ABSTRACT

A FIFO (First-In-First-Out) memory includes a main memory array and a main select circuit having a plurality of serially coupled shift registers, each selecting at least one memory location of the main memory array. The FIFO memory also includes a redundant memory array and a redundant select circuit having a plurality of redundant shift registers, each selecting at least one redundant memory location of the redundant memory array. A switching circuit is provided in the FIFO memory that is coupled to each of the shift registers and each of the redundant shift registers. When a memory location of the main memory is found defective, the switching circuit causes a corresponding shift register of the shift registers to be bypassed in the main select circuit and a redundant shift register of the redundant shift registers to be serially coupled into the main select circuit via a last one of the shift registers.

18 Claims, 7 Drawing Sheets

SHIFT-REGISTER BASED ROW SELECT CIRCUIT WITH REDUNDANCY FOR A FIFO MEMORY

FIELD OF THE INVENTION

The present invention pertains to the field of computer memories. More particularly, this invention relates to a first-in-first-out ("FIFO") memory having a shift register based row decoder and memory redundancy.

BACKGROUND OF THE INVENTION

Figure 1:
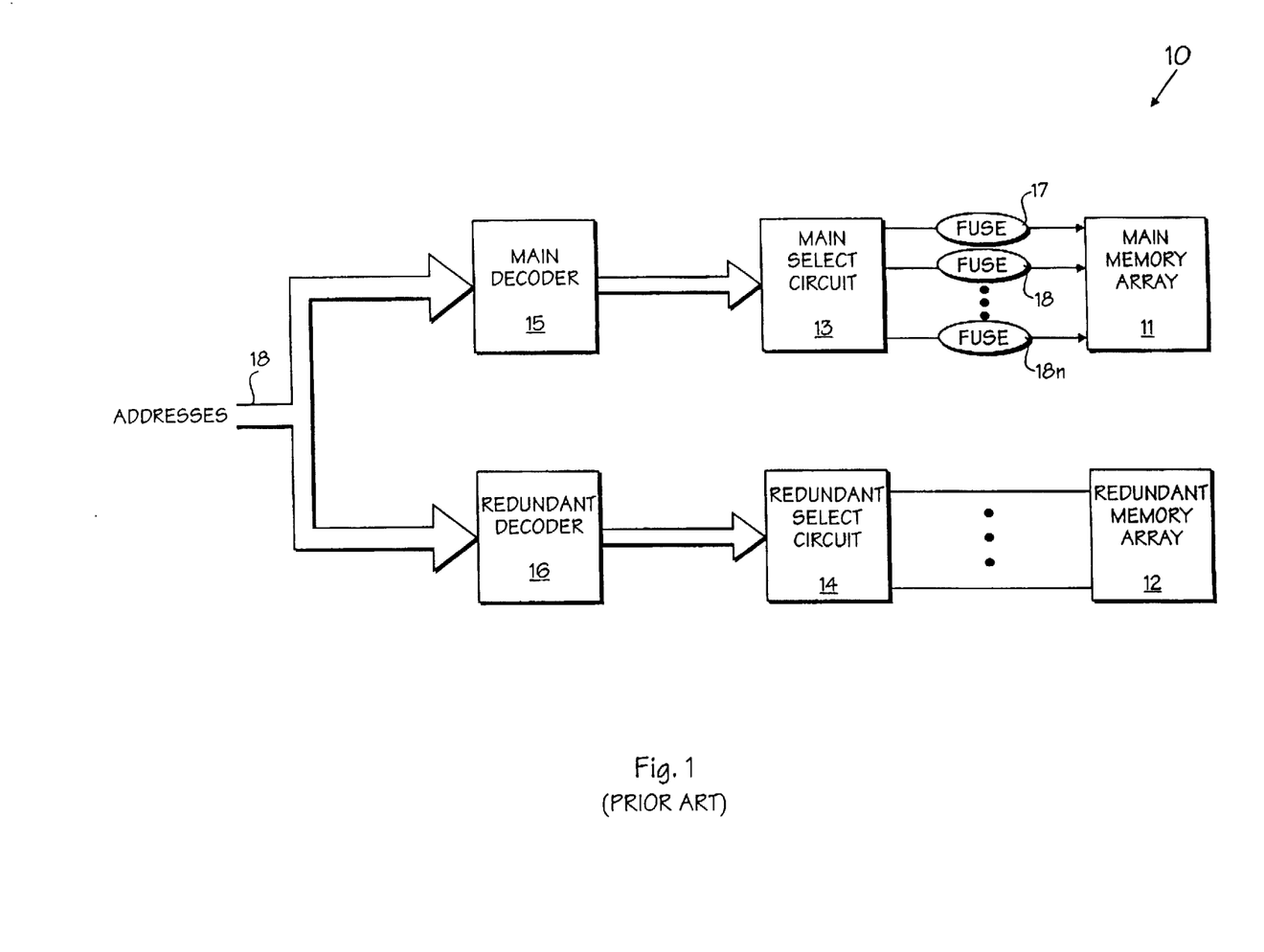
FIG. 1 is a block diagram of a prior art redundant structure for a memory.

With increasing storage capacity of semiconductor memory devices, fabrication of memory devices which are entirely free from defective memory cell is becoming increasingly difficult. When the memory devices which contain a defect are rejected entirely, the production yield of the memory devices is decreased accordingly. In order to avoid such a problem and use the memory devices which contain defective memory cells, a redundant structure is typically used in each memory device wherein redundant columns of memory cells or redundant rows of memory cells are provided to replace defective memory columns or rows. FIG. 1 illustrates a prior art redundant structure for a memory device, which is described below.

As can be seen in FIG. 1, each of the memory elements (i.e., memory row or column) of a main memory array 11 of a memory device 10 is connected to a main select circuit 13 via one of fuse elements 17 through 18n. When one memory element in main memory array 11 is found defective, its associated one of fuse elements 17–18n will be blown with a laser beam such that access to the defective memory element in main memory array 11 is disabled. For example, when the memory element that is connected to fuse element 17 is found defective, fuse element 17 will then be blown to disable the access to that defective memory element from a main decoder 15 and main select circuit 13.

Meanwhile, the address of the defective memory element is programmed by blowing a series of address fuses within a redundant decoder 16. This allows redundant decoder 16 to compare every incoming address with the address programmed. When an incoming address matches the programmed address in redundant decoder 16 (i.e., when the defective memory element is accessed), redundant decoder 16 causes a redundant select circuit 14 to select a redundant memory element in a redundant memory array 12 to be accessed. By doing so, a defective memory element is replaced with a redundant memory element and the memory device operates as if it is a defect-free device.

Figure 2:
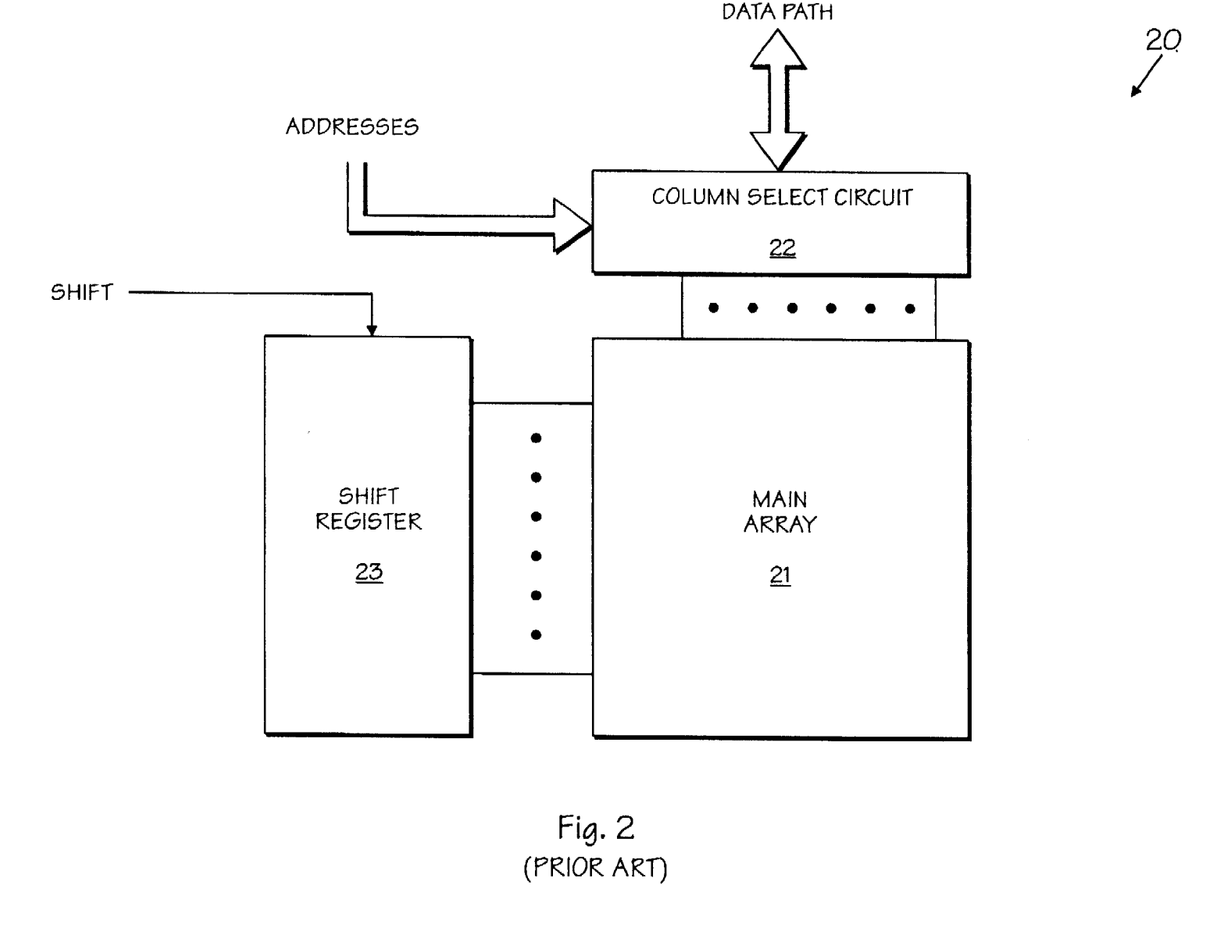
FIG. 2 shows the structure of a prior art FIFO memory without memory redundancy.

One problem of the above described redundant structure is that it does not fit for a FIFO memory structure which uses shift register row selection instead of a row decoder, which is shown in FIG. 2. As can be seen from FIG. 2, instead of having a row decoder, a prior art FIFO memory 20 may have a shift register 23 that is controlled by a SHIFT signal to shift. Shift register 23 typically includes a number of shift registers connected together in a closed loop. In this way, each row of main memory 21 of FIFO memory 20 is sequentially addressed. Due to this structural feature of the FIFO memory, it is typically almost impossible to implement the prior art redundant structure shown in FIG. 1 in the prior art FIFO memory shown in FIG. 2. Hence, it is typically desirable for the FIFO memory to have a new redundant structure.

SUMMARY OF THE INVENTION

One of the features of the present invention is to provide a FIFO memory with redundancy.

Another feature of the present invention is to provide a FIFO memory having a shift register based row decoder and memory redundancy.

A further feature of the present invention is to provide a redundant structure suitable for FIFO memories.

A FIFO (First-In-First-Out) memory is described that includes a main memory array and a main select circuit having a plurality of serially coupled shift registers, each selecting at least one memory location of the main memory array. The FIFO memory also includes a redundant memory array and a redundant select circuit having a plurality of redundant shift registers, each selecting at least one redundant memory location of the redundant memory array. A switching circuit is provided in the FIFO memory that is coupled to each of the shift registers and each of the redundant shift registers. When a memory location of the main memory is found defective, the switching circuit causes a corresponding shift register of the shift registers to be bypassed in the main select circuit and a redundant shift register of the redundant shift registers to be serially coupled into the main select circuit via a last one of the shift registers.

In addition, a shift select circuit is described that includes a main select circuit having a plurality of serially coupled shift registers, a redundant shift register, and a switching circuit coupled to each of the shift registers and the redundant shift register. When a shift register of the shift registers is not to be used, the switching circuit causes the shift register to be bypassed in the main select circuit and the redundant shift register to be serially coupled into the main select circuit via a last one of the shift registers.

BRIEF DESCRIPTION OF THE DRAWINGS

The present invention is illustrated by way of example and not by way of limitation in the figures of the accompanying drawings, in which like references indicate similar elements and in which.

DETAILED DESCRIPTION

Figure 3:
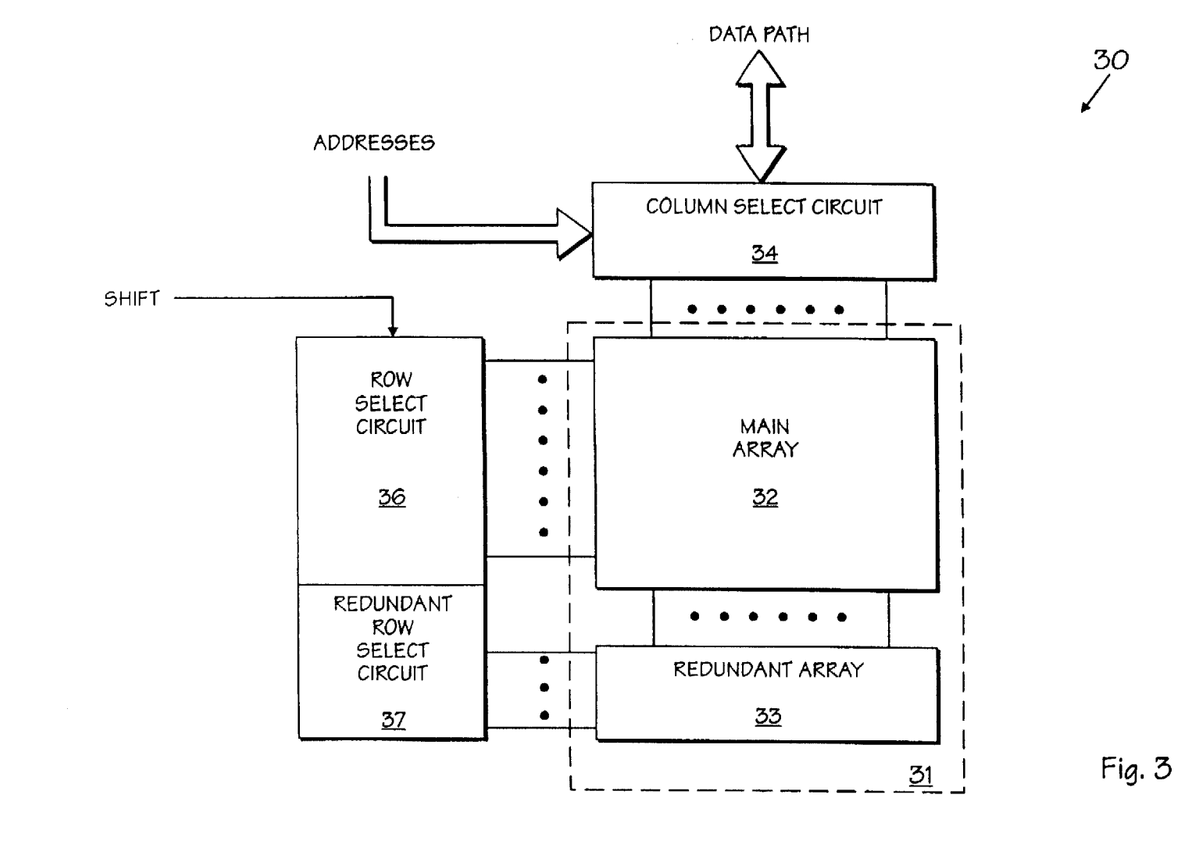
FIG. 3 shows a FIFO memory having memory redundancy in accordance with one embodiment of the present invention.

FIG. 3 illustrates in block diagram form the circuitry of a FIFO memory 30 that implements a memory redundancy in accordance with one embodiment of the present invention. FIFO memory 30 includes a memory array 31 that has a main array 32 and a redundant array 33. Main array 32 is connected to a column select circuit 34 and a row select circuit 36. Redundant array 33 is coupled to column select circuit 34 and a redundant row select circuit 37. Row select circuit 36 and redundant row select circuit 37 together implement a memory redundancy arrangement for FIFO memory 30 in accordance with one embodiment of the present invention. The circuit of circuits 36 and 37 will be described in more detail below, also in conjunction with FIGS. 4–7.

Referring back to FIG. 3, FIFO memory 30 can be used in any kind of computer systems or data processing or transmission systems. In addition, FIFO memory 30 can be implemented by any type of memory. For example, FIFO memory 30 can employ RAM ("Random Access Memory") cells, EPROM ("Electrically Programmable Read-Only Memory") cells, or flash EPROM ("flash Erasable and electrically Programmable Read-Only Memory") cells. In addition, other types of memory cells can also be used in FIFO memory 30.

In one embodiment, all of the circuit of FIFO memory 30 shown in FIG. 3 resides on a single semiconductor substrate.

Each of main array 32 and redundant array 33 is organized into rows and columns. Each intersection of a row and a column is placed with a memory cell, thus forming main array 32 and redundant array 33.

Because memory 30 is a FIFO memory (i.e., first-in-first-out), data will then be stored in a first-in-first-out order in memory 30. This thus causes row select circuit 36 to select the rows of main array 32 in a sequential order, instead of a random access order based on a row address. Thus, row select circuit 36 is not implemented by a decoding circuit, but rather, in one embodiment, by a chain of shift registers that, under control of a shift signal SHIFT, shift a row select signal down the chain such that the rows of main array 32 can be sequentially selected.

Redundant row select circuit 37 is similarly configured by a chain of redundant shift registers that are also controlled by the SHIFT signal. This allows the redundant rows of redundant array 33 to be sequentially addressed when redundancy of FIFO memory 30 is fully activated. FIGS. 4–7 show the circuit of row select circuit 36 and redundant row select circuit 37, which will be described in more detail below.

Referring back to FIG. 3, it is to be noted that FIG. 3 only shows one data access path (i.e., the read or write path) of FIFO memory 30. In order for memory 30 to be able to read and write in the first-in-first-out order, another row select circuit and another redundant row select circuit (both are not shown in FIG. 3) is needed for the other data access path. This other row select circuit has the identical circuit configuration as circuit 36 and the other redundant row select circuit has the same circuit configuration as circuit 37.

Because of the sequential access nature of row select circuit 36, a new arrangement is needed to implement memory redundancy for memory 30. In accordance with one embodiment of the present invention, when a row of main array 32 is found defective, its corresponding shift register (not shown in FIG. 3) in row select circuit 36 is disconnected from the shift register chain of circuit 36 and a first unused redundant shift register (also not shown in FIG. 3) from redundant row select circuit 37 is connected into the shift register chain in order to replace the disconnected shift register. The connected redundant shift register, however, does not cause the corresponding redundant row to be accessed whenever the defective row is accessed. As can be seen from FIG. 4 (which will be described in detail below), row select circuit 36 and redundant row select circuit 37 together allow a defective row from main array 32 not to be accessed (i.e., skipped or bypassed) and a redundant row from redundant array 33 to be added for access such that the total number of rows of memory 30 that are accessible remain unchanged. This redundancy scheme in accordance with one embodiment of the present invention will be described in more detail below, in conjunction with FIGS. 4–7.

Figure 4:
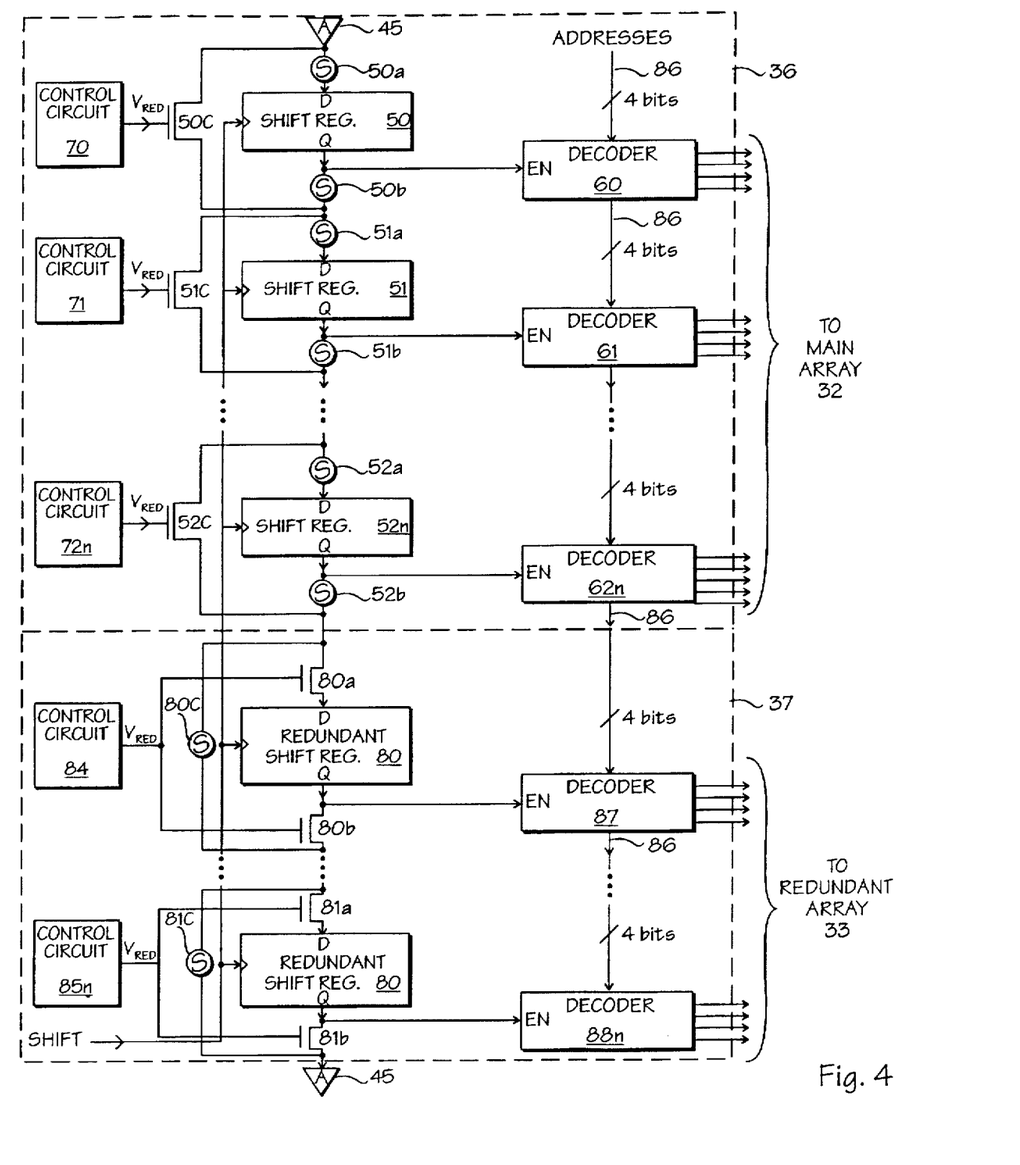
FIG. 4 shows the configuration of the row select circuit and the redundant row select circuit of the FIFO memory of FIG. 3 in accordance with one embodiment of the present invention.

Referring to FIG. 4, the circuits of row select circuit 36 and redundant row select circuit 37 are shown. As can be seen from FIG. 4, circuit 36 includes a number of shift registers 50 through 52n that are serially connected together via a number of switching elements (e.g., switching elements 50a–50b, 51a–51b, and 52a–52b). As can be seen from FIG. 4, each of shift registers 50–52n is connected to two switching elements, one at the input (i.e., the D input) of the shift register and the other at the output (i.e., Q output) of the shift register.

Figure 5:
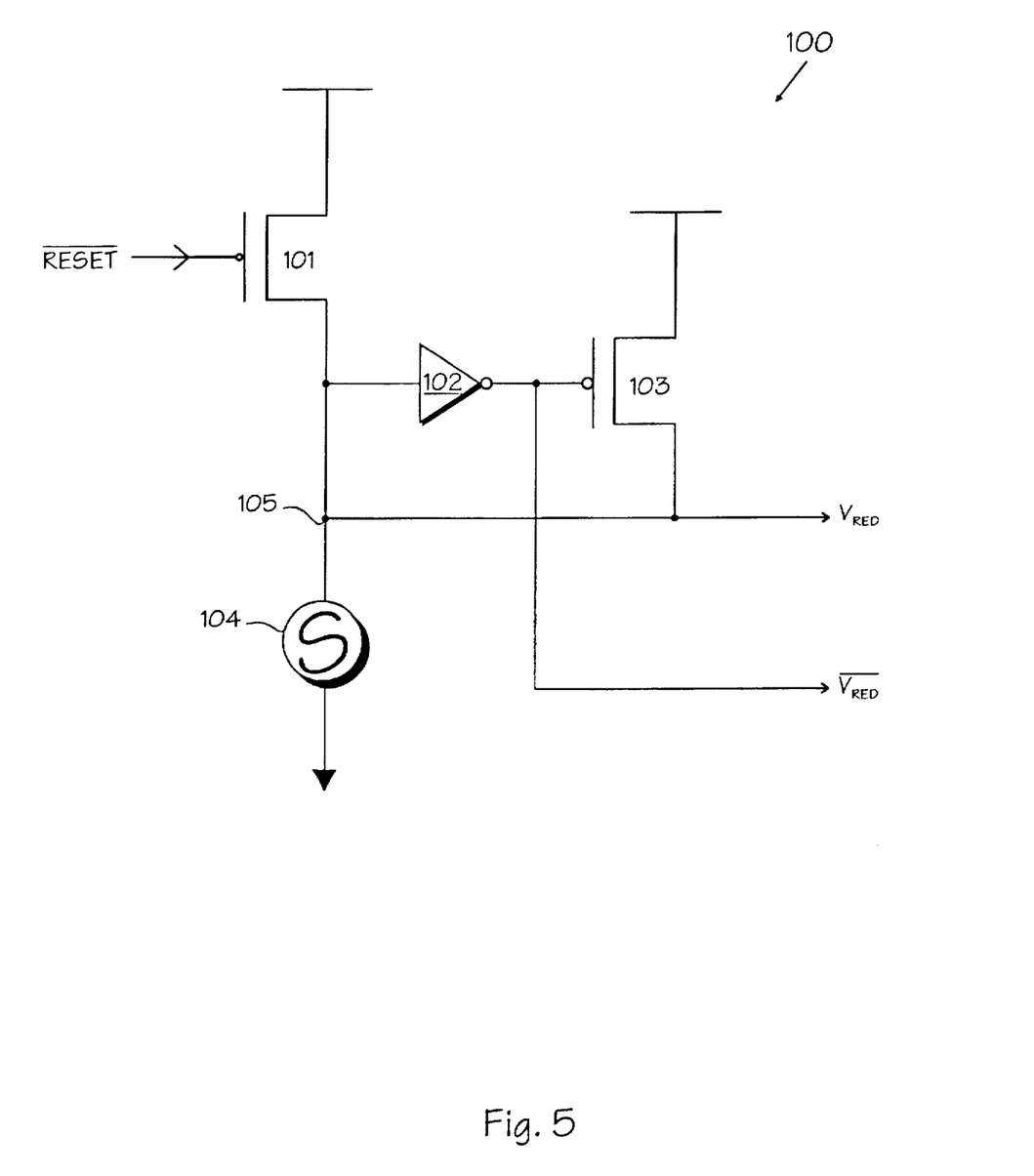
FIGS. 5 and 6 show different circuit configurations of the control circuits shown in FIG. 4.
Figure 6:
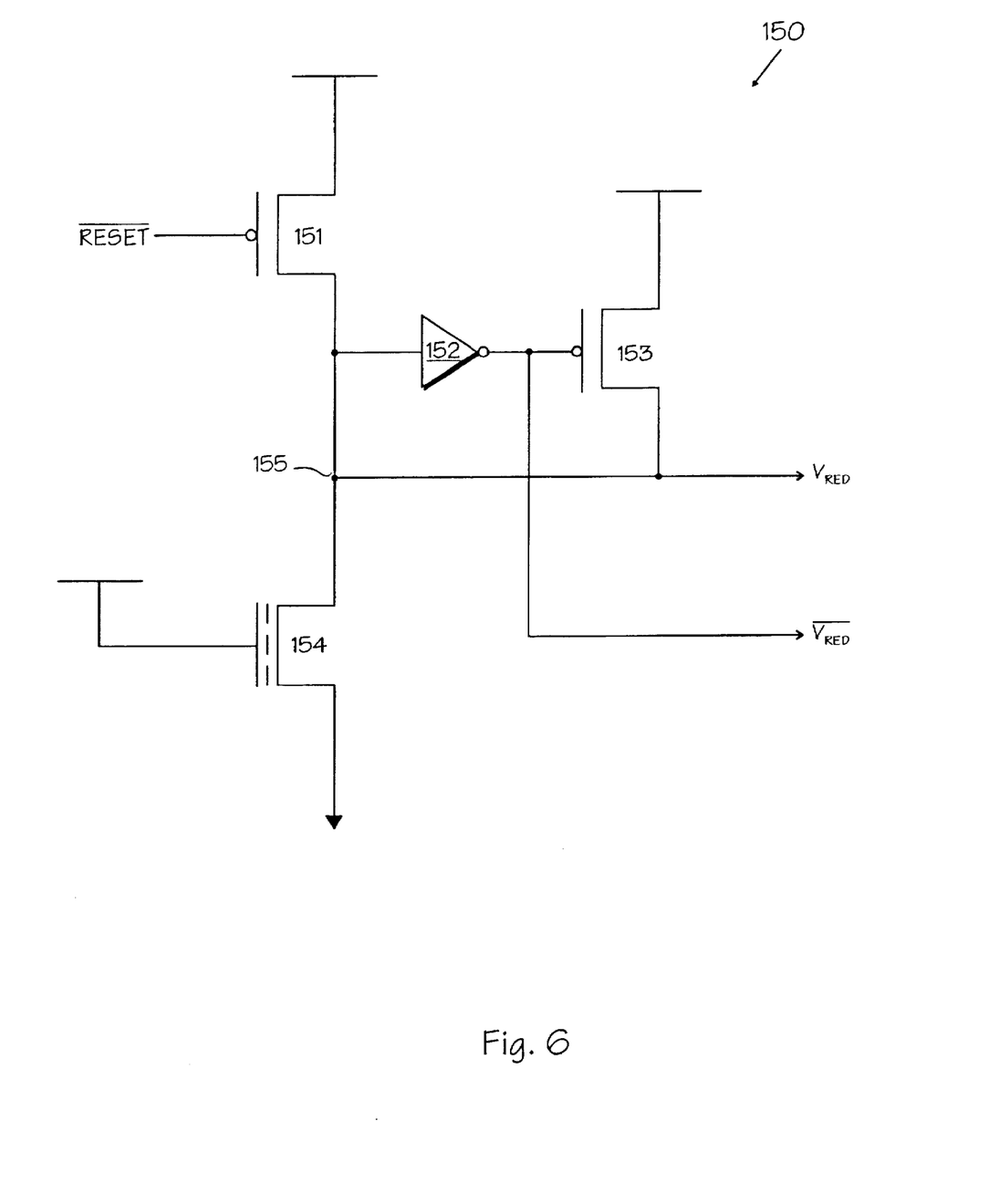

In addition, each of shift registers 50–52n has a bypassing transistor connected in parallel with the corresponding shift register. For example, transistor 50c is connected in parallel with shift register 50 and switching elements 50a–50b and transistor 52c is connected in parallel with shift register 52n and switching elements 52a–52b. Each of transistors 50c through 52c is controlled by a corresponding one of a number of control circuits 70 through 72n. All of control circuits 70–72n have identical user reconfigurable circuit configuration and the circuit of each of control circuits 70–72n is shown in FIGS. 5–6, which will be described in more detail below.

The output (i.e., the Q output) of each of shift registers 50–52n is connected, as an enable input, to an associated one of a number of decoders 60 through 62n. As can be seen, each of decoders 60–62n receives an identical four-bit address from an address bus 86. Which decoder is enabled to decode the four-bit address depends on whether its enable signal is asserted by the corresponding shift register. Based on the four-bit address received, the enabled one of decodes 60–62n activates one of its four outputs. Each output of each of decoders 60–62n is connected to a row of main array 32 of FIG. 3. By this arrangement, the number of shift registers required for circuit 36 is reduced. Alternatively, the number of shift registers can be further reduced by causing each decoder to decode an address of more than four bits, or increased by causing each decoder to decode an address of fewer than four bits. In one embodiment, address bus 86 is connected to a counter or a sequential address generator (not shown) for receiving the four-bit addresses.

Shift registers 50–52n and decoders 60–62n together perform the row selection function of circuit 36 and switching elements 50a–50b, 51a–51b, through 52a–52b, transistors 50c–52c, and control circuits 70–72n constitute the switching part of circuit 36 that, when activated, switch the shift registers that correspond to defective rows in main array 32 out of the shift register chain formed by shift registers 50–52n. As can be seen from FIG. 4, each shift register of circuit 36 is connected to two switching elements and a bypassing transistor such that the shift register can be switched off the chain without breaking up the shift register chain. For example, switching elements 50a–50b and transistor 50c can be used to switch shift register 50 out of the shift register chain formed by registers 50–52n and switching elements 52a–52b and transistor 52c can be used to switch shift register 52n out of the shift register chain.

Similarly, redundant row select circuit 37 includes a number of redundant shift registers 80 through 81n connected in series via a number of redundant switching transistors 80a–80b through 81a–81b. The serially connected redundant shift registers 80–81n are also connected to the shift register chain of shift registers 50–52n of circuit 36 via redundant switching transistors 80a–80b through 81a–81b.

This forms a closed loop of shift registers and redundant shift registers. As can be seen from FIG. 4, the D input of redundant shift register 80 is connected to the Q output of the last shift register of circuit 36 (i.e., shift register 52n) via switching element 52b and switching transistor 80a and the Q output of the last redundant shift register of circuit 37 (i.e., redundant shift register 81n) is connected to a "A" node 45 via switching transistor 81b. Node 45 is then connected to the D input of the very first shift register (i.e., shift register 50) of circuit 36 via switching element 50a. As described above, this causes shift register 50-52n and redundant shift registers 80-81n together to form the closed shift register loop.

It is, however, to be noted that before memory redundancy of memory 30 (FIG. 3) is activated, none of switching transistors 80a-80b through 81a-81b is turned on. This means that none of the redundant shift registers is actually connected into the shift register chain at this time because of the off state of switching transistors 80a-80b through 81a-81b. As can be seen from FIG. 4, each switching transistor pair is controlled by one of a number of control circuits 84-85n. The circuit configuration of each of control circuits 84-85n is identical to that of each control circuits 70-72n.

In addition, as can be seen from FIG. 4, each of the redundant shift registers also has a corresponding bypassing element (e.g., 80c) connected in parallel with the redundant shift register for allowing the closed shift register loop formed by register 50-52n and 80-81n to bypass that redundant shift register. For example, bypassing element 80c is connected in parallel with redundant shift register 80 and switching transistors 80a-80b and bypassing element 81c is connected in parallel with redundant shift register 81n and switching transistors 81a-81b. It shall be noted that before the memory redundancy of FIFO memory 30 (FIG. 3) is activated, each of bypassing elements 80c-81c is on, thus causing each of redundant shift registers 80-81n to be disconnected from the shift register chain formed by shift registers 50-52n.

Figure 7:
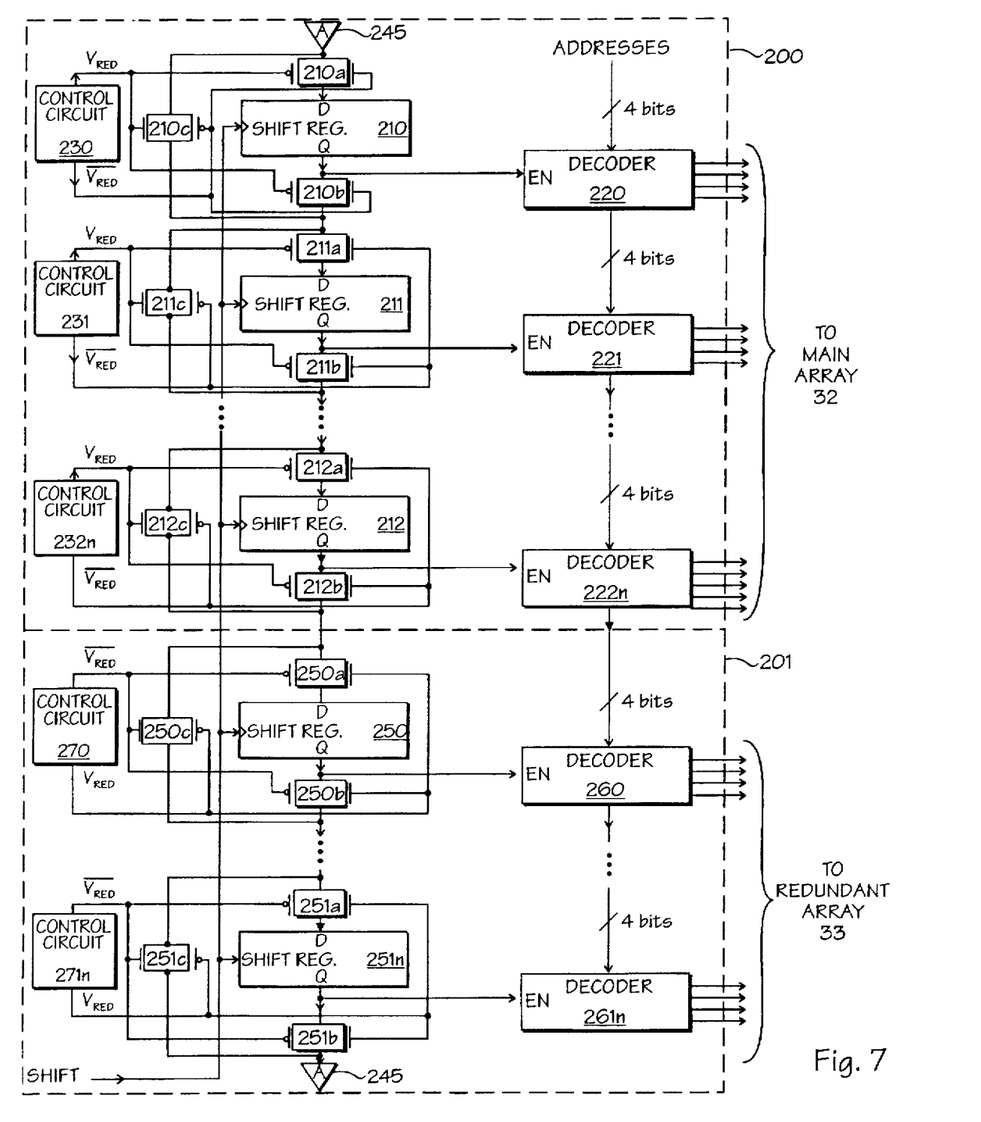
FIG. 7 shows the configuration of the row select circuit and the redundant row select circuit of the FIFO memory of FIG. 3 in accordance with another embodiment of the present invention.

In one embodiment and as can be seen from FIG. 4, each of transistors 50c-52c and 80a-80b through 81a-81b is an N-channel transistor. In other embodiments, each of transistors 50c-52c and 80a-81b can be a P-channel transistor, an electrically programmable floating transistor, a CMOS transistor gate (as shown in FIG. 7), a pass gate, and/or any other type of known switching or gating element.

In addition, in one embodiment and as can be seen from FIG. 4, each of (1) switching elements 50a-50b, 51a-51b, through 52a-52b and (2) redundant bypassing elements 80c-81c is implemented by a fuse element that can by blown off by laser beam. In other embodiments, each of the switching and bypassing elements can be implemented by an N-channel switching transistor, a P-channel switching transistor, an electrically programmable floating gate transistor, a pass gate, a CMOS transistor gate (see FIG. 7), and/or any other known switching or gating means. When an N-channel, a P-channel transistor, or a CMOS transistor gate is used as a switching element, a control circuit is required to switch on or off the transistor or the transistor gate. When a floating gate transistor is used as a switching element, the ON and OFF states of the floating gate transistor is controlled by electrically programming the floating gate transistor to change the threshold voltage of the floating gate transistor.

Redundant row select circuit 37 also includes a number of redundant decoders 87 through 88n, each having its enable input coupled to the output of its associated redundant shift register. In addition, each of redundant decoders 87-88n is also connected to address bus 86 to receive the four-bit address. Each output of each of redundant decoders 87-88n is connected to select a redundant row of redundant array 33 (FIG. 3). The purpose of employing redundant decoders 87-88n is to reduce the number of redundant shift registers employed in circuit 37, same as that of employing decoders 60-62n in circuit 36.

Each of shift registers 50-52n and 80-81n is controlled by the SHIFT signal to shift at the same time. The SHIFT signal, when asserted, causes each of the shift registers 50-52n and 80-81n to shift at the same time, regardless if a shift register is connected to the shift register loop or not.

Initially, each of shift registers 50-52n and 80-81n is reset to store a logical "ZERO" value (assuming enabled value equals logical ONE and disabled value equals logical ZERO). A set shift register (not shown) is provided in row select circuit 36 to provide the logical ONE value to begin the shifting sequence of row select circuit 36. The logical ONE row select value is then shifted down through the loop every time the SHIFT signal is asserted until the logical ONE value is shifted back to node 45. The shift operation can then be repeated under control of the SHIFT signal.

As described above, bypassing transistors 50c-52c are initially controlled to be turned off and bypassing elements 80c-81c are initially controlled to be on. Meanwhile, each of the switching elements (e.g., 50a-50b, 51a-51b, and 52a-52b) of circuit 36 is on (i.e., not blown or not turned off) and each of redundant switching transistors (e.g., 80a-80b and 81a-81b) of circuit 37 is controlled to be turned off. This thus causes shift register 52n to be connected to node 45 via bypassing elements 80c through 81c. At this time, none of redundant shift registers 80-81n is connected into the shift register loop formed by shift registers 50-52n and none of shift registers 50-52n is disconnected from the shift register loop.

When, for example, it is found that shift register 51 corresponds to a defective row of main array 32 (FIG. 3), shift register 51 needs to be disconnected from the shift register loop formed by shift registers 50-52n and a redundant shift register (i.e., register 80) needs to be connected into the shift register loop. When this occurs, switching elements 51a and 51b are controlled to be turned off and transistor 51c is turned on by control circuit 71. This is done by reconfiguring control circuit 71, which is shown in FIGS. 5-6. Switching elements 51a-51b can be turned off by blowing fuses when the switching elements are implemented by the fuses. Other known means can be used to turn off switching elements 51a-51b when the switching elements are implemented by switching transistors or gates. FIG. 7 shows another embodiment of the switching elements, which will be described in more detail below.

Referring again to FIG. 4, when switching elements 51a-51a are turned off and transistor 51c is turned on by reconfigured control circuit 71, shift register 51 is bypassed and disconnected from the shift register loop.

Due to transistor 51c, the shift register loop is, however, not broken by disconnected shift register 51.

It is now required to connect a redundant shift register into the shift register chain or loop. In order to connect redundant shift register 80 into the shift register loop to replace shift register 51, switching transistors 80a and 80b are turned on by control circuit 84 (this is done by reconfiguring circuit 84, as shown in FIGS. 5-6) and bypassing element 80c is controlled to be off. This can be done by blowing fuse if bypassing element 80c is implemented by a fuse, for example. Other known means can also be used to turn off bypassing element 80c if element 80c is implemented by a transistor or gate. When this occurs, redundant shift register 80 is connected into the shift register loop.

Referring now to FIG. 5, the circuit of control circuit 100 is shown that implements one embodiment of each of control circuits 70–72n and 84–85n of FIG. 4. As can be seen from FIG. 5, circuit 100 can be reconfigured by blowing a fuse 104. Before fuse 104 is blown, the output $V_{RED}$ signal is logically low. For this to occur, it is necessary for device 101 to have a much higher on-impedance than fuse 104. After fuse 104 is blown, the $\overline{V_{RED}}$ signal is logically high (i.e., asserted) when the $\overline{RESET}$ signal is pulsed.

FIG. 6 shows another control circuit 150 which implements another embodiment of each of control circuits 70–72n and 84–85n of FIG. 4. As can be seen from FIGS. 5 and 6, the circuit 150 of FIG. 6 is identical to circuit 100 of FIG. 5, except that circuit 150 of FIG. 6 uses an electrically programmable floating gate transistor 154 while fuse 104 is used in circuit 100 of FIG. 5.

As shown in FIG. 6, before transistor 154 is programmed, the $V_{RED}$ signal is logically inactive low. For this to occur, it is necessary for device 151 to have a much higher on-impedance than device 154. When transistor 154 is programmed, the $V_{RED}$ signal becomes logically active high when the $\overline{RESET}$ signal is pulsed. Transistor 154 can be programmed by applying a relatively high voltage to the control gate of the transistor. Once programmed, the threshold voltage of transistor 154 is raised, which causes node 155 to be disconnected from ground even though the power supply voltage is applied to the control gate of the transistor. The power supply voltage at the control gate of transistor would otherwise turn on transistor 154 when transistor 154 is not programmed.

FIG. 7 shows a row select circuit 200 and a redundant row select circuit 201 that implement another embodiment of circuits 36 and 37 of FIGS. 3–4. As can be seen from FIGS. 4 and 7, circuits 200–201 of FIG. 7 are identical to circuits 36 and 37 of FIG. 4, except that CMOS transistor gate (e.g., gates 210a–210c and 251a–251c) are used as the switching and bypassing elements in circuits 200 and 201. As can be seen from FIG. 7, before memory redundancy is activated, CMOS transistor gates 210a–210b through 212a–212b are controlled by control circuits 230 through 232n to be turned on and each of gates 210c through 212c is controlled by one of control circuits 230–232n to be turned off. Similarly, control circuits 270 through 271n cause CMOS transistor gates 250a–250b through 251a–251b to be turned off while causing gates 250c through 251c to be turned on.

When, for example, shift register 211 is to be disconnected, control circuit 231 is reconfigured to cause gates 211a–211b to be turned off and gate 211c to be turned on. In addition, control circuit 270 is reconfigured to cause gates 250a–250b to be turned on and gate 250c to be turned off. This thus causes shift register 211 to be disconnected from the chain and redundant shift register 250 to be connected into the chain. Each of control circuit 230–232n and 270–271n can be controlled by either control circuit 100 of FIG. 5 or control circuit 150 of FIG. 6.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A shift select circuit, comprising:
   (A) a main select circuit having a plurality of serially coupled shift registers;
   (B) a redundant shift register;
   (C) a switching circuit coupled to each of the shift registers and the redundant shift register, wherein when a shift register of the shift registers is not to be used, the switching circuit causes the shift register to be bypassed in the main select circuit and the redundant shift register to be serially coupled into the main select circuit via a last one of the shift registers.

2. The shift select circuit of claim 1, wherein the switching circuit causes the redundant shift register to be serially coupled between the last one of the shift registers and a first one of the shift registers when the shift register is bypassed.

3. The shift select circuit of claim 2, wherein the switching circuit further comprises
   (I) a first set of switching elements and a second set of switching elements;
   (II) a control circuit coupled to the first and second sets of switching elements, the control circuit causing the first set of switching elements to disconnect the shift register from the remaining ones of the shift registers and the second set of switching elements to connect the redundant shift register between the last one of the shift registers and the first one of the shift registers.

4. The shift select circuit of claim 3, wherein each switching element of the first and second sets of switching elements is selected from a group comprising a P-channel transistor, an N-channel transistor, and a CMOS (Complementary Metal-Oxide Semiconductor) pass gate.

5. An address decoding circuit for a FIFO (First-In-First-Out) memory with redundancy, comprising:
   (A) a main select circuit having a plurality of serially coupled shift registers;
   (B) a redundant shift register;
   (C) a switching circuit coupled to each of the shift registers and the redundant shift register, wherein when a shift register of the shift registers is not to be used, the switching circuit causes the not-to-be-used shift register to be bypassed in the main select circuit and the redundant shift register to be serially coupled into the main select circuit via a last one of the shift registers.

6. The address decoding circuit of claim 5, wherein the switching circuit further comprises
   (I) a first switching circuit that, when enabled, disconnects the not-to-be-used shift register from the main select circuit;
   (II) a second switching circuit that, when enabled, connects the redundant shift register between the last one of the shift registers and the first one of the shift registers.

7. The address decoding circuit of claim 6, wherein the first switching circuit further comprises
   (i) a first switching element coupled between a shift input of the not-to-be-used shift register and a shift output of a first adjacent shift register of the not-to-be-used shift register;
   (ii) a second switching element coupled between a shift output of the not-to-be-used shift register and a shift input of a second adjacent shift register of the not-to-be-used shift register;

(iii) a third switching element coupled between the shift output of the first adjacent shift register and the shift input of the second adjacent shift register.

8. The address decoding circuit of claim 7, wherein the second switching circuit further comprises (a) a fourth switching element coupled between a shift output of the last one of the shift registers and a shift input of the redundant shift register;

(b) a fifth switching element coupled between a shift output of the redundant shift register and a shift input of a first one of the plurality of shift registers;

(c) a sixth switching element coupled between the shift output of the last one of the shift registers and the shift input of the first one of the plurality of shift registers.

9. The address decoding circuit of claim 8, wherein each of the first, second, third, fourth, fifth, and sixth switching elements is selected from a group comprising a P-channel transistor, an N-channel transistor, and a CMOS (Complementary Metal-Oxide Semiconductor) pass gate.

10. The address decoding circuit of claim 8, further comprising a control circuit coupled to the first, second, third, fourth, fifth, and sixth switching elements, wherein when the not-to-be-used shift register is not to be used, the control circuit causes (1) the first and second switching elements to be switched off and the third switching element to be switched on such that the not-to-be-used shift register is disconnected from remaining shift registers of the shift registers and (2) the fourth and fifth switching elements to be switched on and the sixth switching element to be switched off such that the redundant shift register is connected into the main select circuit.

11. The address decoding circuit of claim 5, wherein each of the shift registers and the redundant shift register is also coupled to a number of memory locations of the FIFO memory via a decoder.

12. A FIFO (First-In-First-Out) memory, comprising:

(A) a main memory array;

(B) a main select circuit having a plurality of serially coupled shift registers, each selecting at least one memory location of the main memory array;

(C) a redundant memory array;

(D) a redundant select circuit having a plurality of redundant shift registers, each selecting at least one redundant memory location of the redundant memory array;

(E) a switching circuit coupled to each of the shift registers and each of the redundant shift registers, wherein when a memory location of the main memory is found defective, the switching circuit causes a corresponding shift register of the shift registers to be bypassed in the main select circuit and a redundant shift register of the redundant shift registers to be serially coupled into the main select circuit via a last one of the shift registers.

13. The FIFO memory of claim 12, wherein the switching circuit further comprises (I) a first switching circuit that, when enabled, disconnects the corresponding shift register from the main select circuit;

(II) a second switching circuit that, when enabled, connects the redundant shift register to the last one of the shift registers.

14. The FIFO memory of claim 13, wherein the first switching circuit further comprises (i) a first switching element coupled between a shift input of the corresponding shift register and a shift output of a first adjacent shift register of the corresponding shift register;

(ii) a second switching element coupled between a shift output of the corresponding shift register and a shift input of a second adjacent shift register of the corresponding shift register;

(iii) a third switching element coupled between the shift output of the first adjacent shift register and the shift input of the second adjacent shift register.

15. The FIFO memory of claim 14, wherein the second switching circuit further comprises (a) a fourth switching element coupled between a shift output of the last one of the shift registers and a shift input of the redundant shift register;

(b) a fifth switching element coupled between a shift output of the redundant shift register and a shift input of a first one of the plurality of shift registers;

(c) a sixth switching element coupled between the shift output of the last one of the shift registers and the shift input of the first one of the plurality of shift registers.

16. The FIFO memory of claim 15, wherein each of the first, second, third, fourth, fifth, and sixth switching elements is selected from a group comprising a P-channel transistor, an N-channel transistor, and a CMOS (Complementary Metal-Oxide Semiconductor) pass gate.

17. The FIFO memory of claim 15, further comprising a control circuit coupled to the first, second, third, fourth, fifth, and sixth switching elements, wherein when the corresponding shift register is to be bypassed, the control circuit causes (1) the first and second switching elements to be switched off and the third switching element to be switched on such that the corresponding shift register is disconnected from remaining shift registers of the shift registers and (2) the fourth and fifth switching elements to be switched on and the sixth switching element to be switched off such that the redundant shift register is connected into the main select circuit.

18. A method of replacing one of a plurality of serially coupled shift registers in a shift select circuit, comprising the steps of:

bypassing the one of the plurality of shift registers; and
enabling a redundant shift register to be serially coupled to the plurality of shift registers.

* * * * *